United States Patent
Somada

(10) Patent No.: US 11,004,759 B2
(45) Date of Patent: May 11, 2021

(54) ELECTRONIC COMPONENT AND METHOD FOR MANUFACTURING THE SAME

(71) Applicant: Murata Manufacturing Co., Ltd., Nagaokakyo (JP)

(72) Inventor: Hiroshi Somada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 72 days.

(21) Appl. No.: 16/412,822

(22) Filed: May 15, 2019

(65) Prior Publication Data

US 2019/0267303 A1    Aug. 29, 2019

Related U.S. Application Data

(63) Continuation of application No. PCT/JP2017/037020, filed on Oct. 12, 2017.

(30) Foreign Application Priority Data

Dec. 7, 2016 (JP) .............................. JP2016-237299

(51) Int. Cl.
| | | |
|---|---|---|
| H01L 23/02 | (2006.01) | |
| H01L 23/31 | (2006.01) | |
| H01L 23/12 | (2006.01) | |
| H01L 23/29 | (2006.01) | |
| H01L 23/522 | (2006.01) | |
| H01L 23/48 | (2006.01) | |

(52) U.S. Cl.
CPC .......... *H01L 23/3114* (2013.01); *H01L 23/12* (2013.01); *H01L 23/293* (2013.01); *H01L 23/481* (2013.01); *H01L 23/5226* (2013.01)

(58) Field of Classification Search
CPC ... H01L 23/3114; H01L 23/12; H01L 23/293; H01L 23/481; H01L 23/5226
USPC ......................................................... 257/678
See application file for complete search history.

(56) References Cited

U.S. PATENT DOCUMENTS 7,968,378 B2 * 6/2011 Mahler ................. H01Q 19/30
                                                          438/113
8,080,882 B2 * 12/2011 Do .......................... H01L 24/24
                                                          257/774

(Continued)

FOREIGN PATENT DOCUMENTS

| JP | 2005-310954 A | 11/2005 |
|---|---|---|
| JP | 2009-054666 A | 3/2009 |

(Continued)

OTHER PUBLICATIONS

Official Communication issued in International Patent Application No. PCT/JP2017/037020, dated Dec. 26, 2017.

*Primary Examiner* — Luan C Thai
(74) *Attorney, Agent, or Firm* — Keating & Bennett, LLP

(57) ABSTRACT

An electronic component includes a resin structure including first and second surfaces facing each other, an electronic component element contained in the resin structure, including first and second main surfaces facing each other, and side surfaces connecting the first and second main surfaces, and being exposed to the first surface of the resin structure, and a through-electrode penetrating the resin structure to connect the first and second surfaces of the resin structure, in which the through-electrode are in contact with at least one of the side surfaces of the electronic component element.

8 Claims, 11 Drawing Sheets

(56) References Cited

U.S. PATENT DOCUMENTS

| | | | |
|---|---|---|---|
| 8,202,763 B2* | 6/2012 | Meyer | H01L 25/0652 |
| | | | 438/108 |
| 8,922,013 B2* | 12/2014 | Hwang | H01L 23/49827 |
| | | | 257/738 |
| 2009/0051038 A1 | 2/2009 | Jobetto | |
| 2009/0133251 A1 | 5/2009 | Tuominen et al. | |
| 2010/0213616 A1 | 8/2010 | Uchiyama | |
| 2011/0147911 A1 | 6/2011 | Kohl et al. | |

FOREIGN PATENT DOCUMENTS

| | | |
|---|---|---|
| JP | 2009-530801 A | 8/2009 |
| JP | 2010-199129 A | 9/2010 |
| JP | 2013-258238 A | 12/2013 |
| JP | 2016-178108 A | 10/2016 |

* cited by examiner

ELECTRONIC COMPONENT AND METHOD FOR MANUFACTURING THE SAME

CROSS REFERENCE TO RELATED APPLICATIONS

This application claims the benefit of priority to Japanese Patent Application No. 2016-237299 filed on Dec. 7, 2016 and is a Continuation Application of PCT Application No. PCT/JP2017/037020 filed on Oct. 12, 2017. The entire contents of each of these applications are hereby incorporated herein by reference.

BACKGROUND OF THE INVENTION

1. Field of the Invention

The present invention relates to an electronic component in which an electronic component element is included in a resin structure, and a method for manufacturing the same.

2. Description of the Related Art

In the related art, a component built-in electronic component is known in which an electronic component element is embedded in a resin structure. In a manufacturing method described in Japanese Unexamined Patent Application Publication No. 2005-310954, a semiconductor chip is mounted on a base material. Thereafter, a resin material is applied so as to embed the semiconductor chip. The resin material is solidified to form a resin structure. Then, the base material is separated. Thus, an electronic component in which the semiconductor chip is contained in the resin structure is obtained. In this electronic component, a portion of the semiconductor chip that is in contact with the base material is exposed.

In order to obtain the component built-in electronic component as described in Japanese Unexamined Patent Application Publication No. 2005-310954, when the resin structure is formed, the electronic component element is disposed on a support plate, and the support plate with the electronic component element disposed is disposed in a mold. Then, a thermosetting resin is filled in the mold and pressed. Then, the thermosetting resin is solidified by heating, and after the support plate is peeled off, the resin structure including the electronic component element and the solidified resin is obtained. However, positional displacement of the electronic component element contained in the resin structure occurs in some cases, when the thermosetting resin is filled in the mold, or due to pressure when the thermosetting resin is pressed in the mold, or due to solidification shrinkage when the thermosetting resin is solidified by the heating.

SUMMARY OF THE INVENTION

Preferred embodiments of the present invention provide methods for manufacturing an electronic component in each of which positional displacement of the electronic component element contained in a resin structure hardly occurs, and electronic components in which positional accuracy of the electronic component element is improved.

An electronic component according to a preferred embodiment of the present invention includes a resin structure including a first surface and a second surface facing each other, an electronic component element that is contained in the resin structure, includes one main surface, another main surface facing the one main surface, and a plurality of side surfaces connecting the one main surface and the other main surface, and is exposed to the first surface in the resin structure, and a through-electrode that penetrates the resin structure so as to connect the first surface and the second surface in the resin structure, in which the through-electrode is in contact with at least one of the plurality of side surfaces in the electronic component element.

In an electronic component according to a preferred embodiment of the present invention, a plurality of the through-electrodes are provided, and the plurality of through-electrodes are each in contact with a corresponding one of the plurality of side surfaces in the electronic component element. In this case, it is possible to further improve positional accuracy of the electronic component element.

In an electronic component according to a preferred embodiment of the present invention, at least one through-electrode and at least another through-electrode of the plurality of through-electrodes are in contact with respective different side surfaces in the electronic component element. In this case, it is possible to further improve the positional accuracy of the electronic component element.

In an electronic component according to a preferred embodiment of the present invention, in the electronic component element, the plurality of side surfaces include a pair of side surfaces facing each other, the at least one through-electrode is in contact with one of the pair of side surfaces, and the at least another through-electrode is in contact with another of the pair of side surfaces. In this case, it is possible to more effectively improve the positional accuracy of the electronic component element.

An electronic component according to a preferred embodiment of the present invention further includes wiring that is provided in or on the first surface or the second surface in the resin structure and that is electrically connected to the through-electrode.

An electronic component according to a preferred embodiment of the present invention further includes a diffusion prevention film provided on at least the plurality of side surfaces of the electronic component element, and the through-electrode is in contact with the diffusion prevention film. In this case, it is possible to effectively reduce or prevent diffusion of a material of the through-electrode into the electronic component element.

In an electronic component according to a preferred embodiment of the present invention, the electronic component element is a Si semiconductor chip, and the through-electrode is in contact with the diffusion prevention film on one of a plurality of side surfaces in the Si semiconductor chip. In this case, it is possible to effectively reduce or prevent the diffusion of the material of the through-electrode into the Si semiconductor chip.

An electronic component according to a preferred embodiment of the present invention further includes another electronic component element mounted on the first surface or the second surface of the resin structure.

In an electronic component according to a preferred embodiment of the present invention, another electronic component is mounted on the first surface or the second surface of the resin structure. In this manner, a plurality of the electronic components according to preferred embodiments of the present invention may be laminated.

A method for manufacturing an electronic component according to a preferred embodiment of the present invention includes a step of temporarily fixing an electronic component element on a metal sheet using an adhesive, a step of forming a resist pattern including an opening in contact with one of a plurality of side surfaces in the electronic component element so as to expose the metal sheet to the opening, a step of forming a metal film with plating and forming a through-electrode in contact with the side surface of the electronic component element in the opening of the resist pattern, a step of peeling off the resist pattern, a step of applying a resin material on the metal sheet so as to seal the electronic component element and the through-electrode, a step of solidifying the resin material and forming a resin structure, and a step of removing the metal sheet.

A method for manufacturing an electronic component according to a preferred embodiment of the present invention further includes a step of pressing the resin material after applying the resin material.

In a method for manufacturing an electronic component according to a preferred embodiment of the present invention, after the metal sheet is removed, the resin structure is thinned so as to expose the through-electrode to a first surface and a second surface facing each other of the resin structure.

A method for manufacturing an electronic component according to a preferred embodiment of the present invention further includes a step of providing wiring in or on the first surface or the second surface of the resin structure so as to be electrically connected to the through-electrode.

According to the electronic components and the methods for manufacturing electronic components according to the present invention, since the positional displacement of the electronic component element contained in the resin structure hardly occurs, it is possible to effectively improve the positional accuracy of the electronic component element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the accompanying drawings.

It should be noted that each preferred embodiment described herein is illustrative, and that partial substitution or combination of configurations is possible between different preferred embodiments.

First Preferred Embodiment

With reference to FIGS. 1A to 6, a method for manufacturing an electronic component according to a first preferred embodiment of the invention and the electronic component according to the first preferred embodiment will be described.

Figure 1A:
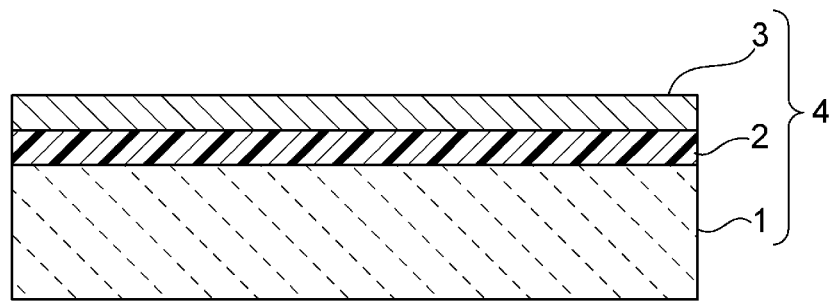
FIGS. 1A and 1B are front sectional views for explaining a method for manufacturing an electronic component according to a first preferred embodiment of the present invention.

First, a multilayer body 4 shown in FIG. 1A is prepared. In the multilayer body 4, a bonding material 2 is bonded to a support plate 1 preferably made of, for example, ceramic, metal, or other suitable material. The bonding material 2 is preferably, for example, a double-sided adhesive. A metal sheet 3 is attached to the bonding material 2.

The metal sheet 3 is preferably made of, for example, a metal foil or a metal film. The metal sheet 3 is harder than an organic material. As a material for the metal sheet 3, appropriate metal or alloy, such as Cu or Al, may preferably be used.

Figure 1B:
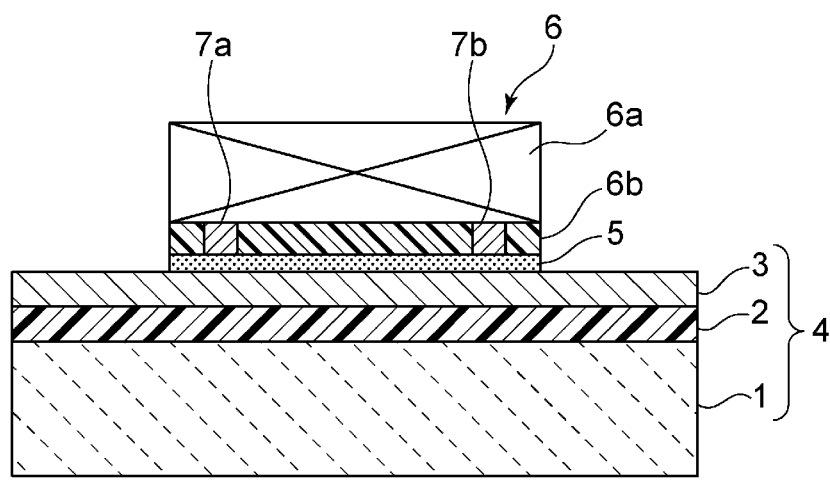
Figure 1C:
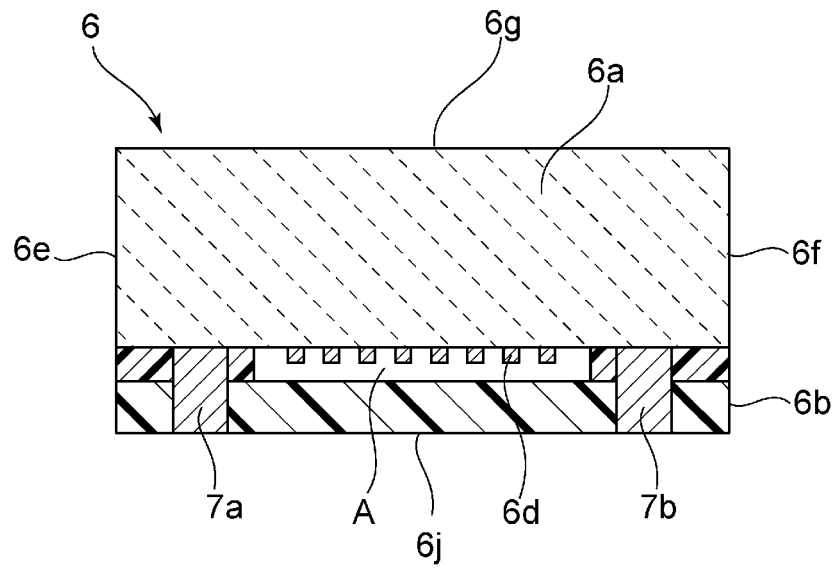
FIG. 1C is a front sectional view enlarging and showing an electronic component element.

Next, as shown in FIG. 1B, an electronic component element 6 is temporarily fixed on the metal sheet 3 using a temporary fixing adhesive 5. In the present preferred embodiment, the electronic component element 6 is preferably, for example, a surface acoustic wave element. FIG. 1C is a front sectional view enlarging and showing the above electronic component element 6. In the electronic component element 6, a functional electrode unit including an IDT electrode 6d is provided on one surface of a piezoelectric body 6a defining an electronic component element main body. Terminals 7a and 7b are provided on the functional electrode unit. In the electronic component element 6, a resin layer 6b including a hollow portion A is provided. The terminals 7a and 7b penetrate the resin layer 6b.

An opposite surface to a side on which the IDT electrode 6d of the piezoelectric body 6a of the electronic component element 6 is provided is one main surface 6g of the electronic component element 6, and an outer surface of the resin layer 6b is another main surface 6j of the electronic component element 6. The electronic component element 6 preferably has a rectangular or substantially rectangular planar shape. A plurality of side surfaces 6e, 6f, 6h, and 6i are provided so as to connect the one main surface 6g and the other main surface 6j. Note that, in FIG. 1C, only the side surfaces 6e and 6f are shown.

However, a structure of the surface acoustic wave element as the electronic component element 6 is not limited to that shown in FIG. 1C.

Moreover, the electronic component element 6 is not limited to an acoustic wave element, and may be a capacitor, an inductor, or other suitable element, or may be a semiconductor element as in a modification of a preferred embodiment described later.

Figure 2A:
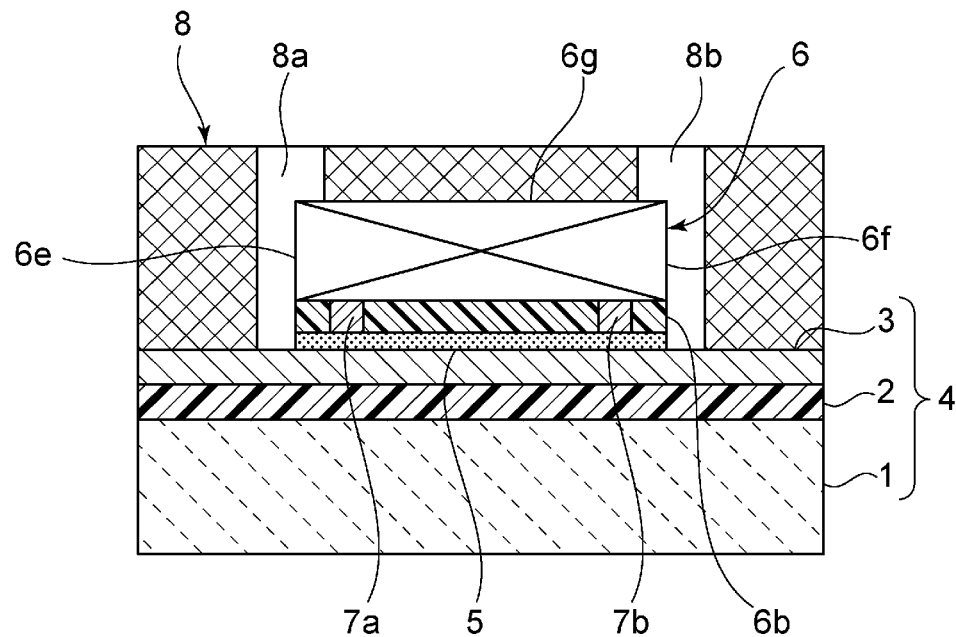
FIGS. 2A and 2B are front sectional views for explaining the method for manufacturing the electronic component according to the first preferred embodiment of the present invention.

As shown in FIG. 2A, a resist pattern 8 is provided by applying, exposing, and developing photoresist. In the resist pattern 8, openings 8a and 8b are provided. The openings 8a and 8b are in contact with the respective side surfaces 6e and 6f of the electronic component element 6. Further, the openings 8a and 8b are widened inward on an upper side of the electronic component element 6. That is, a corner portion defined by the side surface 6e of the electronic component element 6 and the main surface 6g and a portion of the main surface 6g are exposed to the opening 8a, and a corner portion defined by the side surface 6f of the electronic component element 6 and the main surface 6g and a portion of the main surface 6g are exposed to the opening 8b.

Figure 2B:
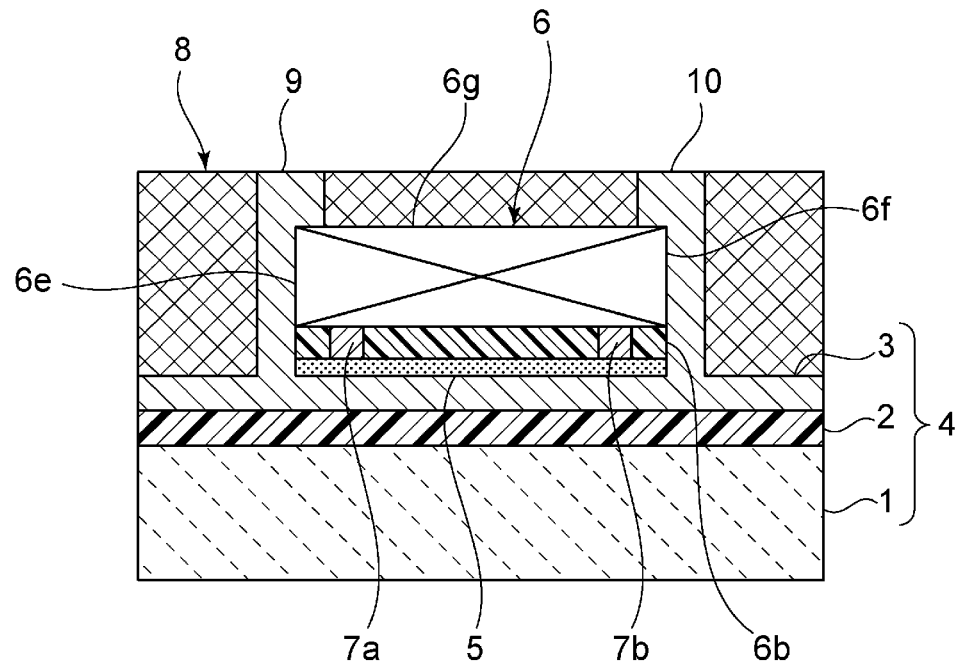

Next, metal is deposited on the metal sheet 3 by electrolytic plating. Thus, through-electrode 9 and 10 shown in FIG. 2B are provided integrally with the metal sheet 3. The through-electrode 9 and 10 are provided by depositing the metal in the respective openings 8a and 8b. Accordingly, the through-electrode 9 and 10 are in contact with the respective side surfaces 6e and 6f of the electronic component element 6. Additionally, the through-electrode 9 and 10 extend to respective portions of the main surface 6g.

Figure 3A:
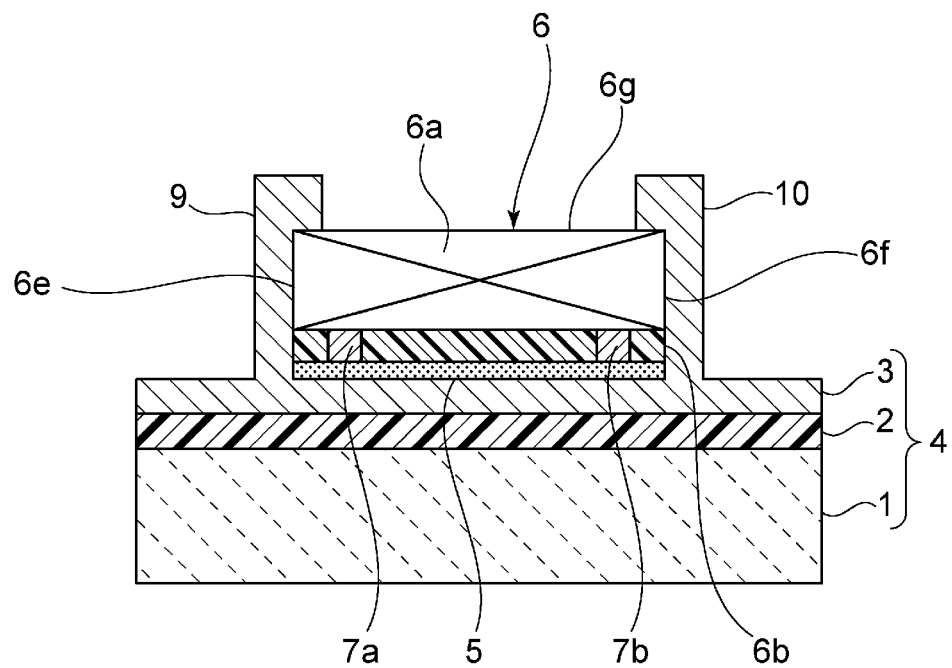
FIGS. 3A and 3B are front sectional views for explaining the method for manufacturing the electronic component according to the first preferred embodiment of the present invention.
Figure 3B:
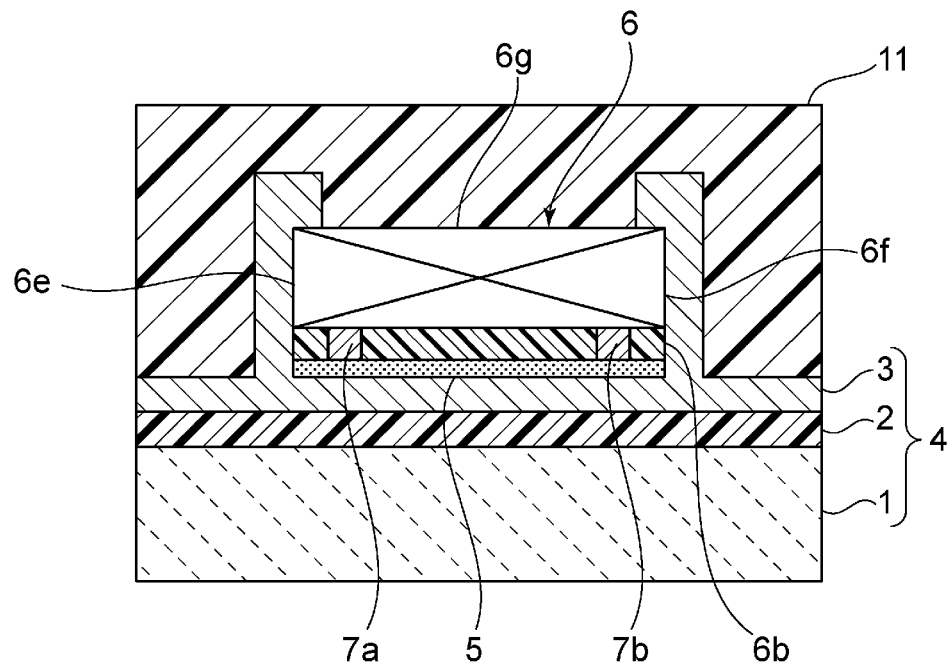

It is possible to form the above through-electrode 9 and 10 with appropriate metal or alloy, such as Cu or Ni, for example. Next, the resist pattern 8 is removed by a solvent. In this manner, as shown in FIG. 3A, the electronic component element 6 is sandwiched by the through-electrode 9, 10, and the metal sheet 3. Thereafter, a structure shown in FIG. 3A is disposed in a mold, and a resin material for a resin structure is applied. As the resin material, a thermosetting resin, for example, is preferably used. The resin material in a fluidized state is filled in the mold, pressed, and solidified by heating. In this manner, a resin structure 11 shown in FIG. 3B is provided.

In the mold, when the resin material is filled, when the resin material is pressed after the filling, and when the resin material is heated and solidified, stress is applied to the electronic component element 6. Thus, as described above, in the prior art, positional displacement of the electronic component element in the resin structure has been likely to occur.

In contrast, in the present preferred embodiment, since the side surfaces 6e and 6f of the electronic component element 6 are in contact with the respective through-electrode 9 and 10, positional displacement of the electronic component element 6 due to the stress described above is reduced or prevented. Thus, it is possible to effectively improve positional accuracy of the electronic component element 6 in the resin structure 11.

In particular, in the present preferred embodiment, the through-electrode 9 is in contact with one side surface 6e of the side surfaces 6e and 6f facing each other, and the through-electrode 10 is in contact with another side surface 6f. Accordingly, since the electronic component element 6 is sandwiched by the through-electrode 9 and the through-electrode 10, it is possible to more effectively reduce or prevent the positional displacement of the electronic component element 6.

In addition, since the through-electrode 9 and 10 also extend to the respective portions of the one main surface 6g of the electronic component element 6, the positional displacement of the electronic component element 6 in the resin structure 11 is effectively reduced or prevented.

However, in the present invention, the through-electrode does not have to extend to the one main surface 6g of the electronic component element 6. Further, although it is preferable to provide a plurality of through-electrodes, it is also possible that only one through-electrode is provided so as to come into contact with the side surface of the electronic component element 6.

Further, in the present preferred embodiment, although the through-electrodes 9 and 10 are in contact with the respective side surfaces 6e and 6f facing each other, a through-electrode may be in contact with a plurality of different side surfaces other than the side surfaces facing each other. For example, as shown in a schematic plan sectional view in FIG. 11, the through-electrode 9 that is in contact with the side surface 6e of the electronic component element 6, and through-electrode 10A and 10B that are in contact with the respective side surfaces 6h and 6i that connect the side surfaces 6e and 6f may be provided.

Figure 11:
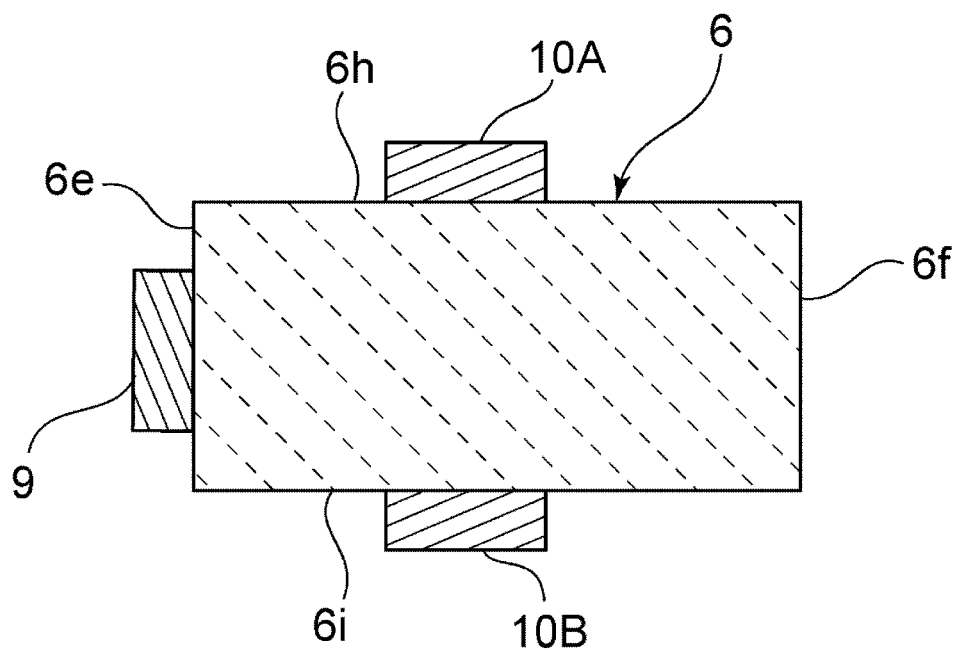
FIG. 11 is a schematic plan sectional view for explaining an electronic component according to another modification of a preferred embodiment of the present invention.

Note that, in FIG. 11, although a cross section of each of the through-electrodes 10A and 10B has a rectangular or substantially rectangular shape, an electrode having a circular cross section, for example, may also be used.

Figure 4A:
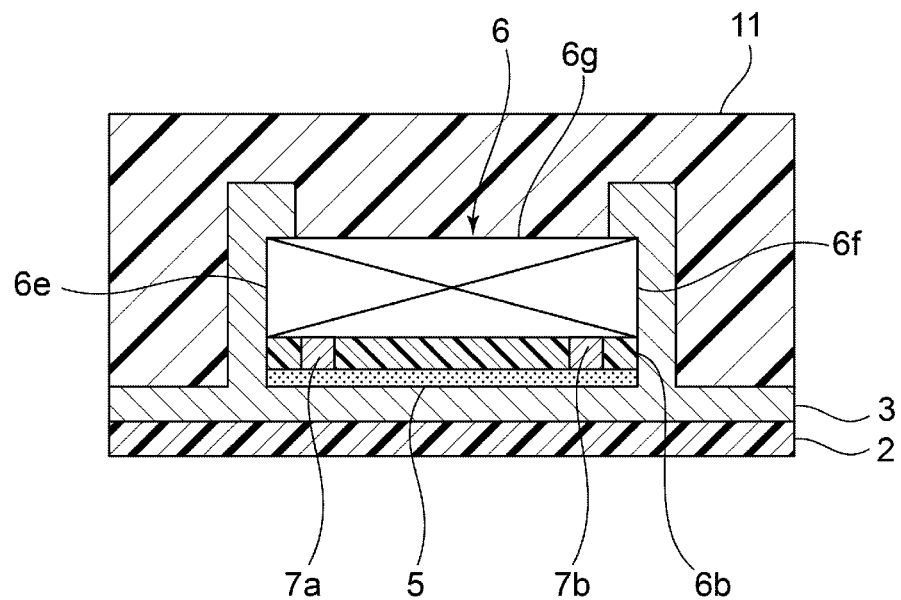
FIGS. 4A and 4B are front sectional views for explaining the method for manufacturing the electronic component according to the first preferred embodiment of the present invention.

Next, the support plate 1 is peeled off. As shown in FIG. 4A, a structure is obtained in which the metal sheet 3 and the bonding material 2 remain on one side of the resin structure 11.

Next, the metal sheet 3 and the bonding material 2 are removed by etching or other suitable method.

Note that, although the structure in which the metal sheet 3 and the bonding material 2 remain on the one side of the resin structure 11 is obtained in FIG. 4A, the support plate 1 and the bonding material 2 may be peeled off at the same time when the support plate 1 is peeled off. In this case, the bonding material 2 is not included in the structure shown in FIG. 4A.

Figure 4B:
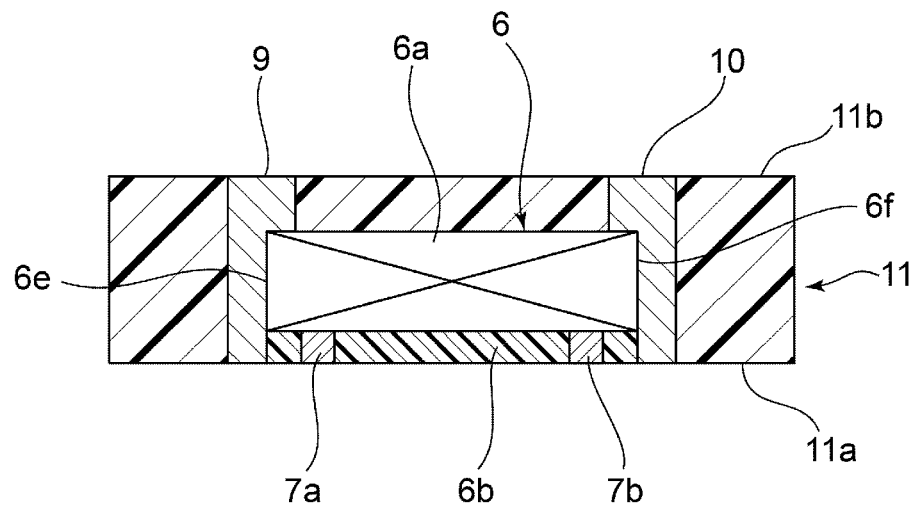

Further, a lower surface and an upper surface of the resin structure 11 are polished. As a result, as shown in FIG. 4B, the electronic component element 6 is exposed to a first surface 11a of the resin structure 11. Then, the terminals 7a and 7b are also exposed to a side of the first surface 11a. On the other hand, the through-electrode 9 and 10 penetrate the resin structure 11 so as to connect the first surface 11a and a second surface 11b of the resin structure 11.

Figure 5:
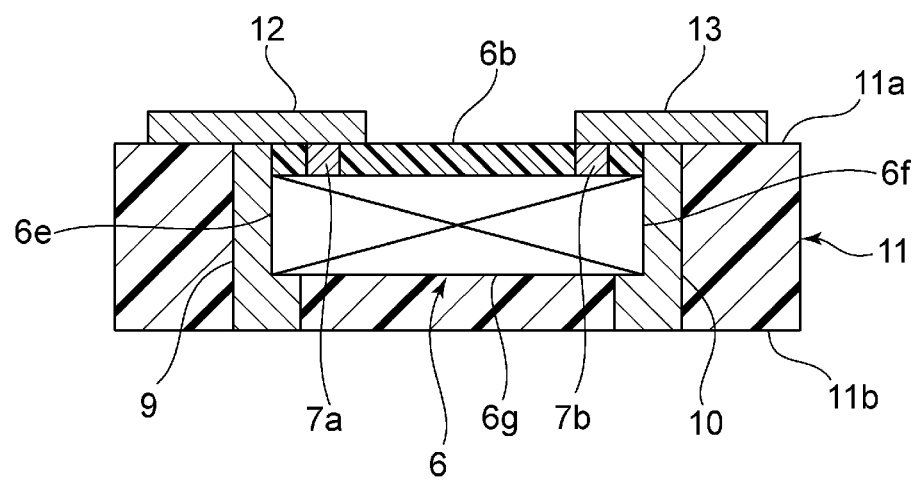
FIG. 5 is a front sectional view for explaining the method for manufacturing the electronic component according to the first preferred embodiment of the present invention.

Next, as shown in FIG. 5, the resin structure 11 is inverted. In this state, wiring 12 and wiring 13 are provided on the first surface 11a. Each of the wiring 12 and the wiring 13 extends from an upper side of the first surface 11a of the resin structure 11 to an outer surface of the resin layer 6b of the electronic component element 6. The wiring 12 is electrically connected to the terminal 7a. Further, the wiring 12 is electrically connected to the through-electrode 9. The wiring 13 is connected to the terminal 7b. Further, the wiring 13 is electrically connected to the through-electrode 10.

Figure 6:
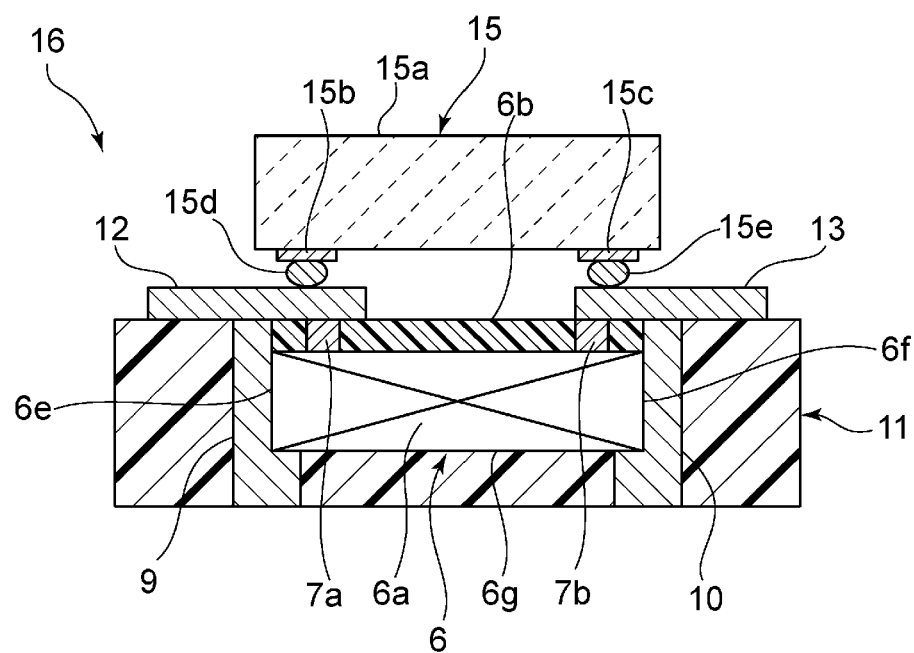
FIG. 6 is a front sectional view for explaining the electronic component obtained in the first preferred embodiment of the present invention.

Next, as shown in FIG. 6, another electronic component element 15 is mounted on the wiring 12 and the wiring 13. The other electronic component element 15 includes an electronic component element main body 15a, electrode lands 15b and 15c provided on a lower surface of the electronic component element main body 15a, and metal bumps 15d and 15e. The metal bumps 15d and 15e are respectively bonded to the wiring 12 and the wiring 13.

A structure of the electronic component element 15 is not particularly limited, and the electronic component element 15 is used not only for a surface acoustic wave element, but also for an acoustic wave element and other suitable element using acoustic waves, such as boundary acoustic waves, for example. Also, the electronic component element 15 may be a capacitor, an inductor, or other suitable element, for example. Further, the electronic component element 15 may be a semiconductor element.

As described above, it is possible to obtain an electronic component 16 according to the first preferred embodiment shown in FIG. 6. In the electronic component 16 according to the first preferred embodiment, as described above, the positional accuracy of the electronic component element 6 in the resin structure 11 is effectively improved.

Second Preferred Embodiment

With reference to FIGS. 7A to 9B, a method for manufacturing an electronic component according to a second preferred embodiment of the present invention will be described.

First, a structure shown in FIG. 1B of the first preferred embodiment is obtained. Up to this point, the second preferred embodiment is the same or substantially the same as the first preferred embodiment regarding the manufacturing method.

Figure 7A:
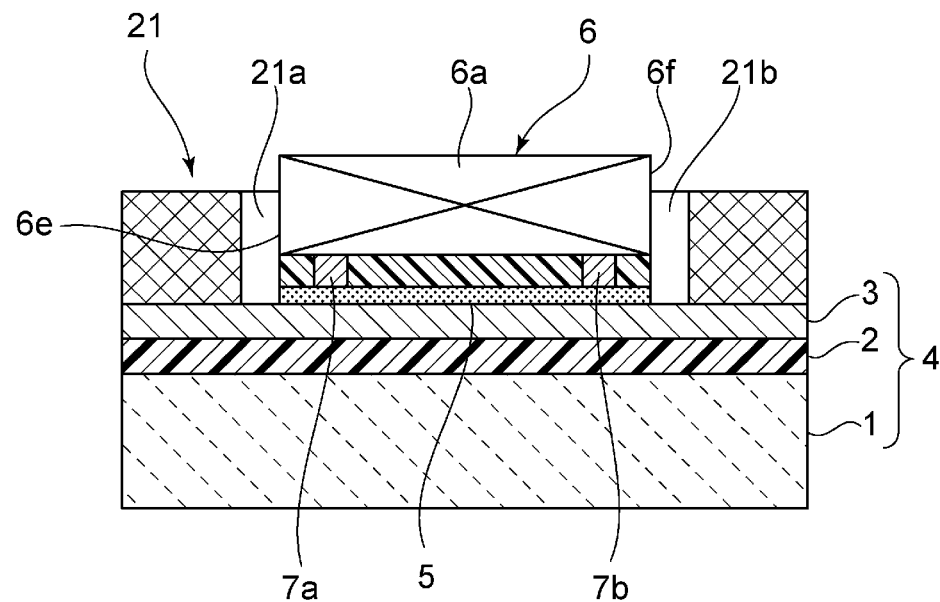
FIGS. 7A and 7B are front sectional views for explaining a method for manufacturing an electronic component according to a second preferred embodiment of the present invention.

Next, in the structure shown in FIG. 1B, a resist pattern 21 shown in FIG. 7A is provided on the metal sheet 3. The resist pattern 21 is obtained by applying, exposing, and developing a photoresist. In the resist pattern 21, openings 21a and 21b are provided on respective portions at which through-electrodes are to be provided later. In addition, in the resist pattern 21, no resist remains on a top surface of the electronic component element 6.

Note that, when viewed in plan view, the openings 21a and 21b are preferably circular or substantially circular openings, for example. In the resist pattern 21, a resist material is in contact with four side surfaces of the electronic component element 6, except for the respective portions at which the openings 21a and 21b are provided.

Next, metal is deposited inside the openings 21a and 21b by electrolytic plating. That is, the metal is deposited inside the openings 21a and 21b by the electrolytic plating using the metal sheet 3.

Figure 7B:
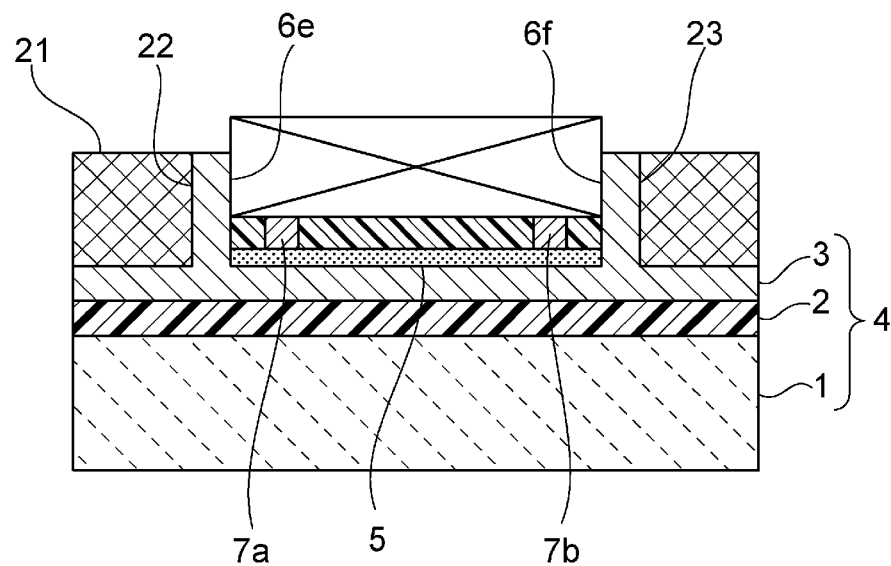

In this manner, as shown in FIG. 7B, through-electrode 22 and 23 are provided. An upper end of the opening 21a does not extend to an upper end of the side surface 6e, and an upper end of the opening 21b does not extend an upper end of the side surfaces 6f. Thus, the through-electrode 22 is not in contact with an entire area in a length direction of the side surface 6e, and the through-electrode 23 is not in contact with an entire area in a length direction of the side surface 6f. That is, the through-electrode 22 is in contact with the electronic component element 6 in a region from an intermediate height position of the side surface 6e to a lower end of the side surface 6e, and the through-electrode 23 is in contact with the electronic component element 6 in a region from an intermediate height position of the side surface 6f to a lower end of the side surface 6f. In this manner, in the present preferred embodiment, the through-electrode does not have to be in contact with the entire or substantially the entire area in a height direction of the side surface of the electronic component element.

Also in the present preferred embodiment, the through-electrode 22 and 23 are in contact with the respective side surfaces 6e and 6f of the electronic component element 6.

Additionally, the metal sheet 3 is in contact with a lower surface of the electronic component element 6 with the temporary fixing adhesive 5 interposed therebetween.

Figure 8A:
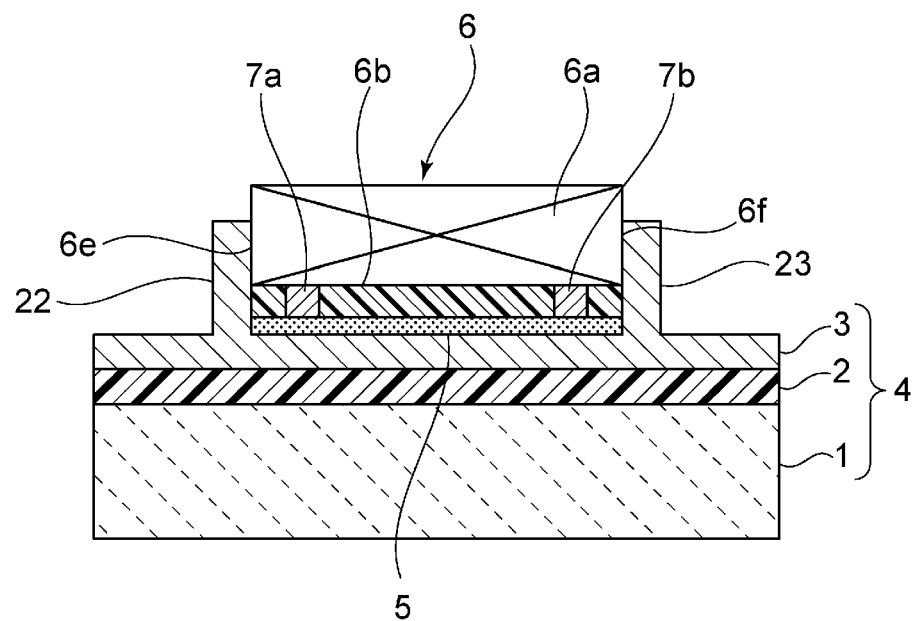
FIGS. 8A and 8B are front sectional views for explaining a method for manufacturing an electronic component according to the second preferred embodiment of the present invention.
Figure 8B:
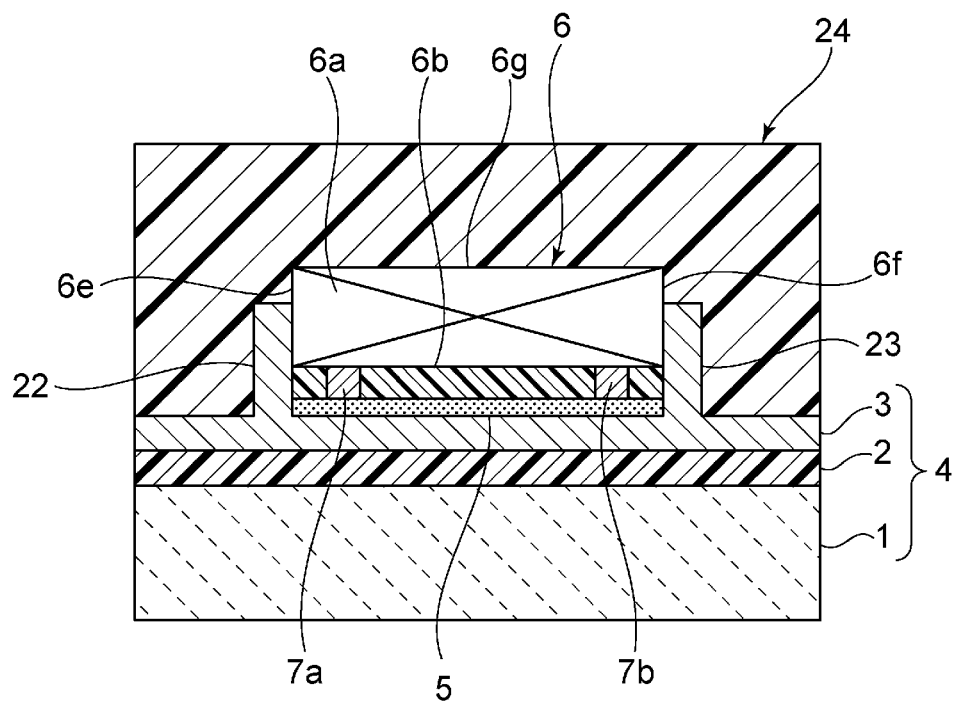

Next, the resist pattern 21 is removed using a solvent. In this manner, a structure shown in FIG. 8A is obtained. As in the case of the first preferred embodiment, this structure is disposed in a mold, and a resin material made of a thermosetting resin is filled. Then, pressing and heating are performed for solidification. In this manner, a resin structure 24 shown in FIG. 8B is obtained.

When the resin material is applied, pressed, and heated for the solidification, stress is applied to the electronic component element 6, but also in the present preferred embodiment, since the through-electrode 22 and 23 are in contact with the electronic component element 6, the positional displacement of the electronic component element 6 hardly occurs.

Figure 9A:
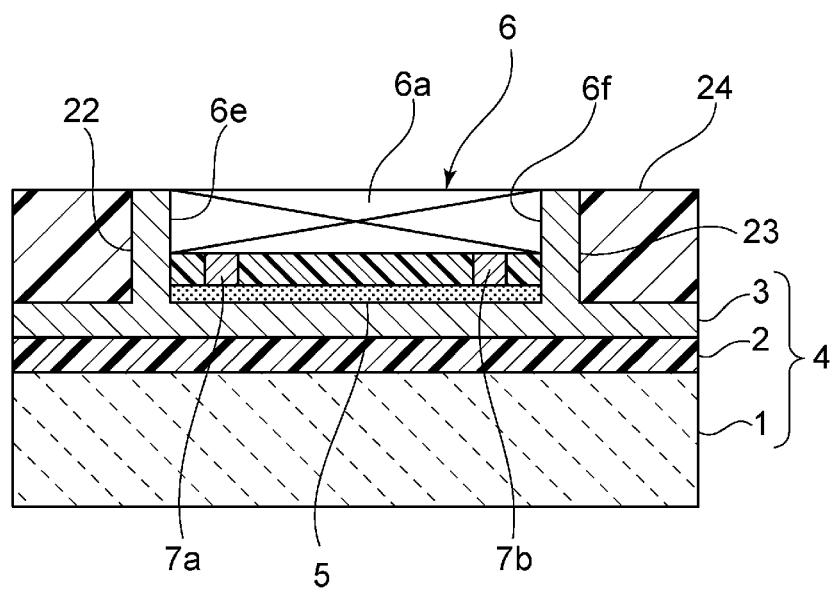
FIGS. 9A and 9B are front sectional views for explaining a method for manufacturing an electronic component according to the second preferred embodiment of the present invention.
Figure 9B:
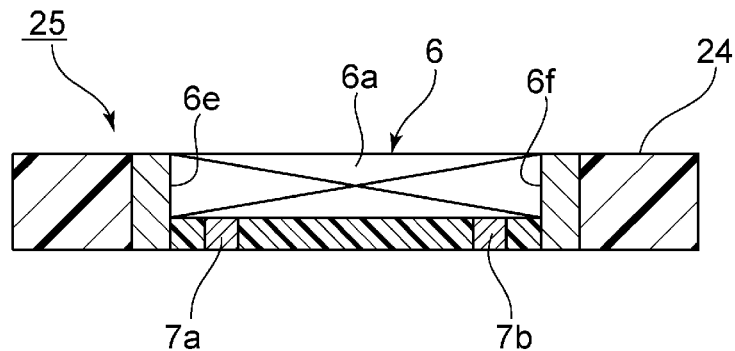

Next, the resin structure 24 is polished to expose the through-electrode 22 and 23, and a thickness of the piezoelectric body 6a as the electronic component element main body is reduced. In this manner, as shown in FIG. 9A, a thickness of the resin structure 24 is reduced, and the thickness of the piezoelectric body 6a is also reduced.

Hereinafter, in the same or substantially the same manner as in the first preferred embodiment, the support plate 1, the bonding material 2, the metal sheet 3, and the temporary fixing adhesive 5 are removed. In this manner, it is possible to obtain an electronic component 25 shown in FIG. 9B. In the electronic component 25 according to the second preferred embodiment, positional accuracy of the electronic component element 6 in the resin structure 24 is effectively improved.

Figure 10:
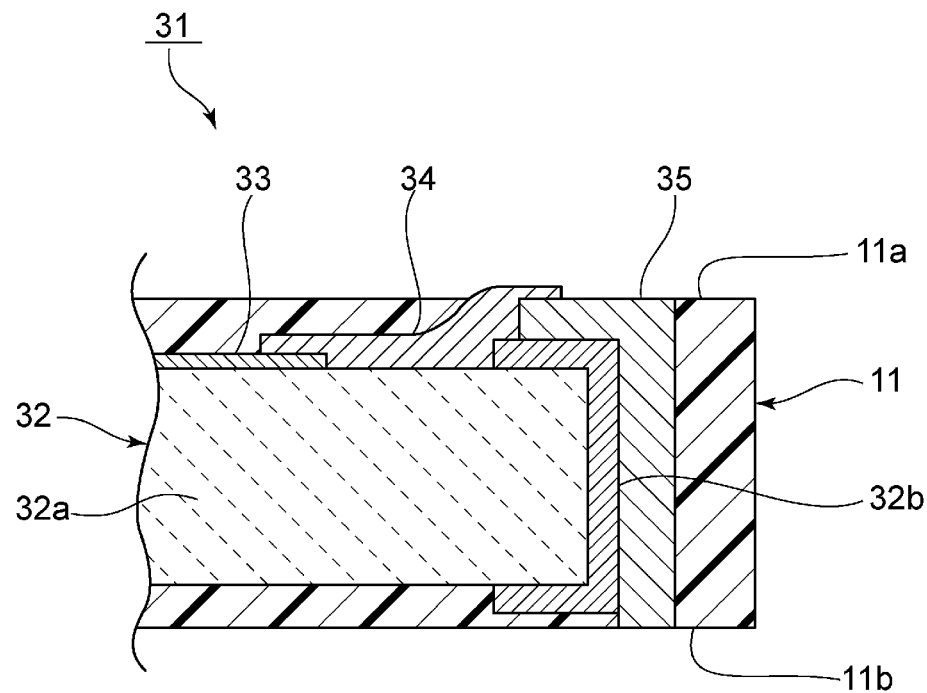
FIG. 10 is a partial cutaway enlarged front sectional view for explaining an electronic component according to a modification of a preferred embodiment of the present invention.

FIG. 10 is a partial cutaway enlarged front sectional view for explaining a modification of an electronic component according to a preferred embodiment of the present invention.

In an electronic component 31 according to the present modification, an electronic component element 32 including an Si semiconductor chip 32a is embedded in the resin structure 11. A functional electrode, such as a gate electrode 33, defining an FET is provided on the Si semiconductor chip 32a. The gate electrode 33 is connected to a through-electrode 35 through wiring 34. The through-electrode 35 penetrates the resin structure 11 and connects the first surface 11a and the second surface 11b of the resin structure 11.

In the present modification, the electronic component 31 includes a diffusion prevention film 32b. The diffusion prevention film 32b extends from a side surface to an upper surface and a lower surface of the electronic component element 32. The diffusion prevention film 32b is positioned between the through-electrode 35 and the Si semiconductor chip 32a. The diffusion prevention film 32b prevents diffusion of metal of the through-electrode 35 to a side of the Si semiconductor chip 32a. Thus, the diffusion prevention film 32b is preferably made of a material whose diffusion coefficient with respect to Si is smaller than that of the metal of the through-electrode 35. The diffusion prevention film 32b may preferably be made of, for example, an insulating material, or a conductive material.

As in the present modification, the electronic component element 32 may include the diffusion prevention film 32b on the side surface. In this case, the through-electrode 35 comes into contact with the side surface of the Si semiconductor chip 32a, not directly, but with the diffusion prevention film 32b interposed therebetween. Even in this case, due to presence of the through-electrode 35, positional displacement of the electronic component element 32 due to stress when the resin structure 11 is provided hardly occurs.

Note that, although the electronic component element 32 includes the Si semiconductor chip 32a, other semiconductor chips, such as a GaAs semiconductor chip, for example, may also be used. Further, the electronic component element 32 may be a piezoelectric element, rather than the semiconductor chip.

Third to Fifth Preferred Embodiments

Figure 12:
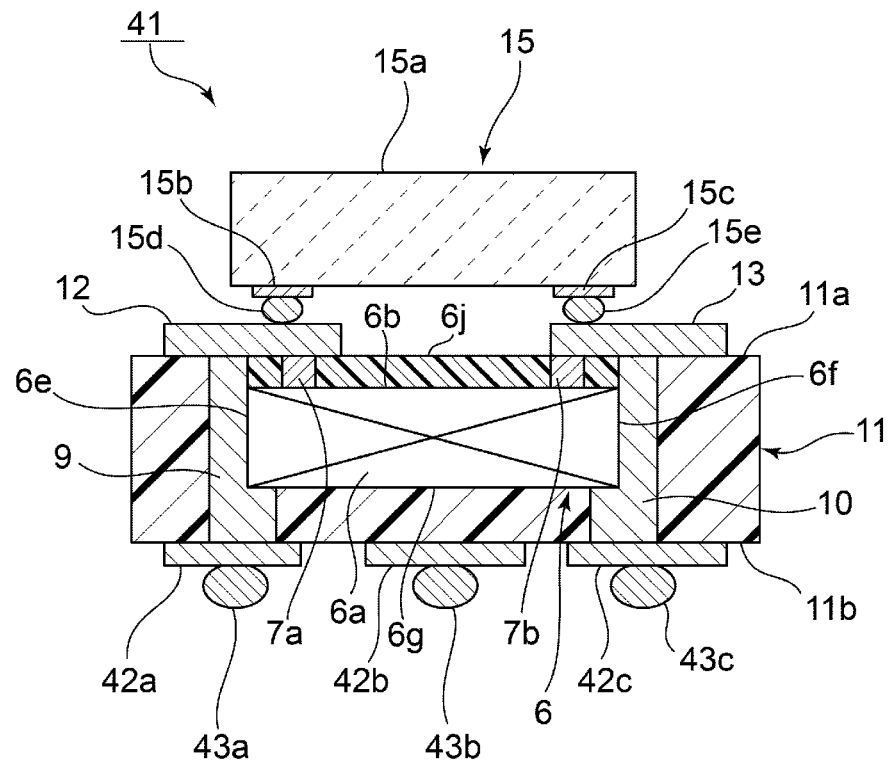
FIG. 12 is a front sectional view of an electronic component according to a third preferred embodiment of the present invention.

FIG. 12 is a front sectional view of an electronic component according to a third preferred embodiment of the present invention.

In an electronic component 41, terminal electrodes 42a through 42c are provided on the second surface 11b of the resin structure 11. Metal bumps 43a to 43c are provided on the respective terminal electrodes 42a to 42c. The terminal electrodes 42a and 42c are connected to respective through-electrodes 9 and 10. The terminal electrode 42b is electrically connected to the electronic component element 6 or the electronic component element 15 in a portion that is not shown.

Other structures of the electronic component 41 are the same or substantially the same as those of the electronic component 16. Accordingly, positional displacement of the electronic component element 6 in the resin structure 11 hardly occurs in the electronic component 41.

It is possible to easily mount the electronic component 41 on a printed circuit board or other substrate, by using the metal bumps 43a to 43c.

Figure 13:
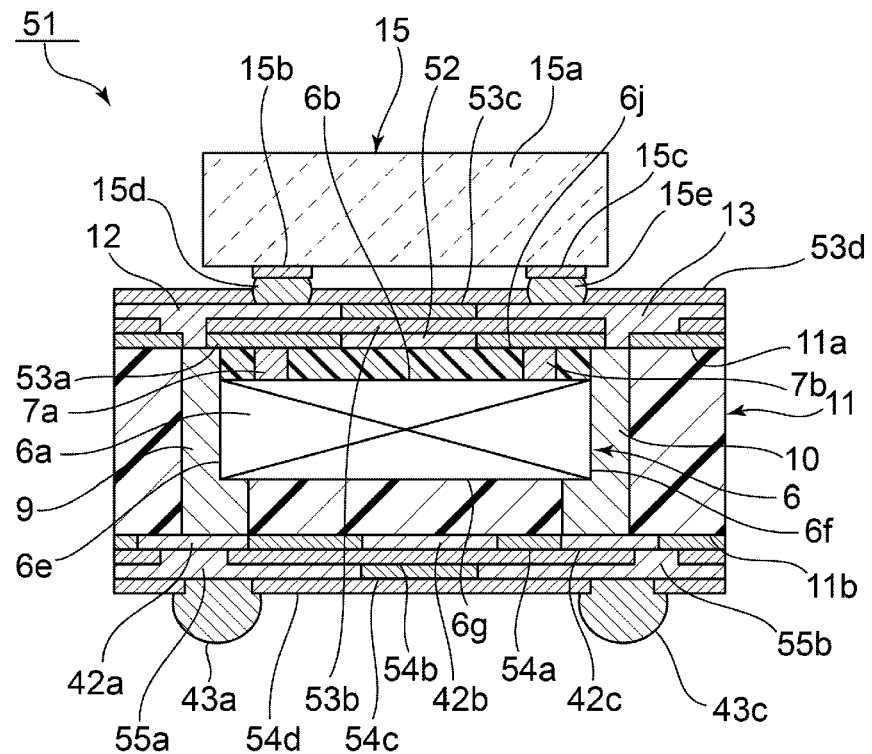
FIG. 13 is a front sectional view of an electronic component according to a fourth preferred embodiment of the present invention.

FIG. 13 is a front sectional view of an electronic component according to a fourth preferred embodiment of the present invention.

In an electronic component 51, the wiring 12 and the wiring 13 are provided on the first surface 11a of the resin structure 11. In addition to the wiring 12 and the wiring 13, wiring 52 is further provided. The wiring 52 is electrically connected to the electronic component element 6 in a portion that is not shown. The terminals 7a and 7b of the electronic component element 6 are also electrically connected to the wiring 52, the wiring 12, or the wiring 13, in portions that are not shown.

A plurality of insulating layers 53a through 53d are laminated on the first surface 11a.

Similar to the electronic component 41, the terminal electrodes 42a to 42c are also provided also on the second surface 11b. Also on the second surface 11b, insulating layers 54a to 54d are laminated. Note that, wiring 55a and wiring 55b are laminated on the respective terminal electrodes 42a and 42c. The metal bumps 43a and 43c are respectively bonded to the wiring 55a and wiring 55b.

Other structures of the electronic component 51 are the same as or similar to those of the electronic component 41. In this manner, the plurality of insulating layers 53a to 53d and the plurality of insulating layers 54a to 54d may be provided on the first surface 11a and the second surface 11b, together with the wiring 12, the wiring 13, the terminal electrodes 42a, 42b, 42c, the wiring 55a, the wiring 55b, or other elements.

Figure 14:
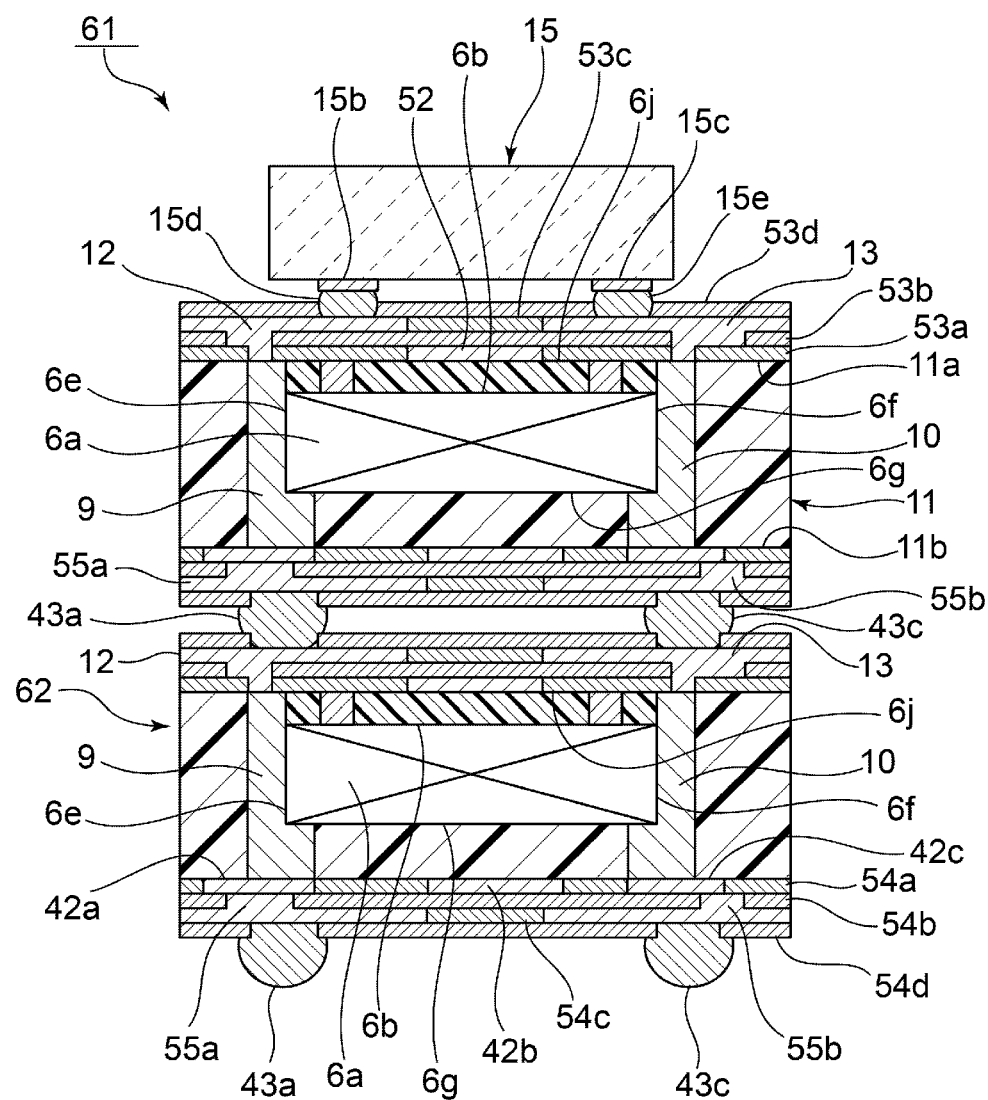
FIG. 14 is a front sectional view of an electronic component according to a fifth preferred embodiment of the present invention.

FIG. 14 is a front sectional view of an electronic component according to a fifth preferred embodiment of the present invention.

In an electronic component 61, another electronic component 62 is further laminated below the resin structure 11 in the electronic component 51. A structure of the electronic component 62 is the same as or similar to that of an electronic component positioned below the electronic component element 15 in the electronic component 51. Thus, the same reference numerals are used for the same or similar structure, and description thereof will not be repeated.

In this manner, in the electronic component including the resin structure 11, an electronic component configured according to a preferred embodiment of the present invention may further be laminated on at least one of the first surface 11a and the second surface 11b.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a resin structure including a first surface and a second surface facing each other;
   an electronic component element contained in the resin structure, including a first main surface, a second main surface facing the first main surface, and a plurality of side surfaces connecting the first main surface and the second main surface, and being exposed to the first surface of the resin structure; and
   a through-electrode penetrating the resin structure so as to connect the first surface and the second surface of the resin structure; wherein
   the through-electrode is in contact with at least one of the plurality of side surfaces of the electronic component element.

2. The electronic component according to claim 1, wherein
   a plurality of the through-electrodes are provided; and
   the plurality of through-electrodes are each in contact with a corresponding one of the plurality of side surfaces of the electronic component element.

3. The electronic component according to claim 2, wherein at least one through-electrode and at least another through-electrode of the plurality of through-electrodes are respectively in contact with different side surfaces of the electronic component element.

4. The electronic component according to claim 3, wherein
   in the electronic component element, the plurality of side surfaces include a pair of side surfaces facing each other;
   the at least one through-electrode is in contact with one of the pair of side surfaces; and
   the at least another through-electrode is in contact with another of the pair of side surfaces.

5. The electronic component according to claim 1, further comprising wiring that is provided in or on the first surface or the second surface of the resin structure and that is electrically connected to the through-electrode.

6. The electronic component according to claim 1, further comprising:
a diffusion prevention film provided on at least the plurality of side surfaces of the electronic component element; wherein
the through-electrode is in contact with the diffusion prevention film.

7. The electronic component according to claim 6, wherein
the electronic component element is an Si semiconductor chip; and
the through-electrode is in contact with the diffusion prevention film on one of a plurality of side surfaces of the Si semiconductor chip.

8. The electronic component according to claim 1, further comprising another electronic component element mounted on the first surface or the second surface of the resin structure.

\* \* \* \* \*